(12) United States Patent
Minich et al.

(10) Patent No.: US 10,788,542 B2
(45) Date of Patent: Sep. 29, 2020

(54) DETECTION OF DETERIORATED ELECTRICAL CONNECTIONS IN A METER USING TEMPERATURE SENSING AND TIME VARIABLE THRESHOLDS

(71) Applicant: Landis+Gyr LLC, Lafayette, IN (US)

(72) Inventors: Mark David Minich, Lafayette, IN (US); Steven John Schamber, Lafayette, IN (US)

(73) Assignee: Landis+Gyr LLC, Lafayette, IN (US)

( * ) Notice: Subject to any disclaimer, the term of this patent is extended or adjusted under 35 U.S.C. 154(b) by 0 days.

(21) Appl. No.: 16/513,177

(22) Filed: Jul. 16, 2019

(65) Prior Publication Data

US 2019/0391198 A1 Dec. 26, 2019

Related U.S. Application Data

(63) Continuation of application No. 15/719,095, filed on Sep. 28, 2017, now Pat. No. 10,393,791.

(51) Int. Cl.
*G01R 31/04* (2006.01)
*G01R 31/68* (2020.01)
(Continued)

(52) U.S. Cl.
CPC ............. *G01R 31/68* (2020.01); *G01D 4/004* (2013.01); *G01R 22/068* (2013.01); *G01R 35/04* (2013.01)

(58) Field of Classification Search
CPC .......... G01R 1/28; G01R 11/00; G01R 11/32; G01R 21/005; G01R 22/00; G01R 35/005; G01R 35/04; G05B 2219/37348
See application file for complete search history.

(56) References Cited

U.S. PATENT DOCUMENTS 4,491,790 A 1/1985 Miller
4,646,003 A 2/1987 Phillips et al.
(Continued)

FOREIGN PATENT DOCUMENTS

WO 2018072030 A1 4/2018
WO 2018083902 A1 5/2018
WO 2019026791 A1 2/2019

OTHER PUBLICATIONS

U.S. Appl. No. 15/719,095, "Notice of Allowance", dated Apr. 18, 2019, 9 pages.

*Primary Examiner* — Tung X Nguyen
(74) *Attorney, Agent, or Firm* — Kilpatrick Townsend & Stockton LLP

(57) ABSTRACT

A utility meter includes a meter housing that supports at least one current coil, a temperature sensor, and a processing circuit coupled to both. The current coil can be coupled to receive heat energy from a meter socket. The temperature sensor disposed generates a sensor signal based on a temperature within the meter housing. The processing circuit obtains the sensor signal and generates meter temperature information based at least in part thereon. The processing circuit also obtains a first predetermined threshold based on at least one of time of day information and date information. The processing circuit also determines whether an abnormal condition exists by comparing the meter temperature information to a value based on the first predetermined threshold, and generates an output signal to a memory, display or communication circuit responsive to determining that the abnormal condition exists.

20 Claims, 8 Drawing Sheets

(51) Int. Cl.
  *G01D 4/00* (2006.01)
  *G01R 35/04* (2006.01)
  *G01R 22/06* (2006.01)

(56) References Cited

U.S. PATENT DOCUMENTS

| | | | |
|---|---|---|---|
| 6,615,147 | B1 | 9/2003 | Jonker et al. |
| 6,816,360 | B2 | 11/2004 | Brooksby et al. |
| 7,059,200 | B2 | 6/2006 | Sallee |
| 7,135,850 | B2 | 11/2006 | Ramirez |
| 7,469,190 | B2 | 12/2008 | Bickel |
| 7,513,683 | B2 | 4/2009 | Sanderford et al. |
| 7,683,642 | B2 | 3/2010 | Martin et al. |
| 7,693,670 | B2 | 4/2010 | Durling et al. |
| 7,990,806 | B2 | 8/2011 | Chen |
| 8,004,933 | B2 | 8/2011 | Iseli |
| 8,121,741 | B2 | 2/2012 | Taft et al. |
| 8,223,466 | B2 | 7/2012 | Roscoe |
| 8,322,215 | B2 | 12/2012 | Lakich et al. |
| 8,326,554 | B2 | 12/2012 | Caird |
| 8,635,036 | B2 | 1/2014 | Pamulaparthy et al. |
| 8,754,634 | B2 | 6/2014 | Chamarti et al. |
| 8,830,083 | B2 | 9/2014 | LaFrance et al. |
| 8,854,217 | B2 | 10/2014 | Brown et al. |
| 8,947,246 | B2 | 2/2015 | Aiken |
| 8,978,443 | B2 | 3/2015 | Ramirez |
| 8,996,144 | B2 | 3/2015 | LaFrance et al. |
| 9,164,135 | B2 | 10/2015 | Cs et al. |
| 9,304,014 | B2 | 4/2016 | Komati et al. |
| 9,341,686 | B2 | 5/2016 | Deak et al. |
| 9,476,740 | B2 | 10/2016 | Zigovszki et al. |
| 9,557,392 | B2 | 1/2017 | Schuhl et al. |
| 9,602,895 | B2 | 3/2017 | Bowling et al. |
| 9,671,254 | B2 | 6/2017 | Zigovszki et al. |
| 9,887,051 | B2 | 2/2018 | LaFrance et al. |
| 9,891,088 | B2 | 2/2018 | Zigovszki et al. |
| 10,240,961 | B2 | 3/2019 | Cheng et al. |
| 10,254,315 | B2 | 4/2019 | Higashi et al. |
| 10,295,578 | B2 | 5/2019 | Higashi et al. |
| 10,393,791 | B2 | 8/2019 | Minich et al. |
| 10,527,704 | B2 | 1/2020 | Minich |
| 2013/0226485 | A1* | 8/2013 | Pietrowicz ............ H04L 41/12 702/62 |
| 2014/0327449 | A1 | 11/2014 | Shuey et al. |
| 2016/0027516 | A1 | 1/2016 | Beroset et al. |
| 2017/0082501 | A1* | 3/2017 | Loy ..................... G01K 3/14 |
| 2018/0073910 | A1 | 3/2018 | Deak et al. |
| 2018/0106640 | A1 | 4/2018 | Padrones et al. |
| 2019/0041439 | A1 | 2/2019 | Brown |
| 2019/0094329 | A1 | 3/2019 | Minich |
| 2019/0101411 | A1 | 4/2019 | Davis et al. |
| 2019/0219618 | A1 | 7/2019 | Davis et al. |

* cited by examiner

DETECTION OF DETERIORATED ELECTRICAL CONNECTIONS IN A METER USING TEMPERATURE SENSING AND TIME VARIABLE THRESHOLDS

CROSS-REFERENCES TO RELATED APPLICATION

This is a continuation of U.S. patent application Ser. No. 15/719,095, filed Sep. 28, 2017, now allowed, and is also related to co-pending U.S. patent application Ser. No. 15/719,086, filed Sep. 28, 2017, the entirety of both being incorporated herein by reference

FIELD OF THE INVENTION

This invention relates generally to electricity meters, and more particularly, to electricity meters having temperature sensing.

BACKGROUND OF THE INVENTION

Utility meters are devices that, among other things, measure the consumption of a utility-generated commodity, such as electrical energy, gas, or water, by a residence, factory, commercial establishment or other such facility. Utility service providers employ utility meters to track customer usage of the utility-generated commodities. Utility service providers track customer usage for many purposes, including billing and demand forecasting.

Electricity meters that measure energy consumption or power consumption typically connect between a utility power line and a load. For example, an electricity meter for a residential customer is often connected at the point at which the electrical system of the residence connects to the utility line. The meter may thereby perform measurements regarding the energy consumed by the load.

Electricity meters often include one or more electrical contacts across which the load voltage and a significant amount of current may be found. For example, meters often have blades that connect to the power line to enable the measurement of load current and load voltage from within the meter. The blades are received by the jaws of a meter mounting device of the building. Spring compression within the jaws retains the blades securely. If the meter is to be replaced or repaired, then the meter may be pulled out of the mounting device, and hence the blades out of the jaws. Although the blades and jaws are usually mechanically robust, they are nevertheless subject to wear, and possibly corrosion, particularly if the meter has been removed or replaced several times. If wear on the jaws is significant, or if the jaws have corrosion, then there is a possibility of introducing a non-trivial resistance at the jaw/blade connection, which is undesirable. In some cases, the jaw/blade connection can undesirably deteriorate to a condition in which arcing occurs.

Likewise, certain meters have switches that allow for disconnection of electrical service to a load. For example, many meters allow for remote disconnection of the load. Such switches necessarily must have substantial contacts because they carry the entire current of the load when the switch is closed. If these switches are used with some frequency, then there is a potential for degradation. Degradation of the switch contacts increases the resistance over the switch contacts. As with the meter blades and jaws, resistance creates additional power loss within the meter, and potentially arcing, both undesirable.

It is known to detect the possible deterioration of meter switch contacts by measuring the resistance and/or current through the contacts within the meter. If the resistance exceeds a threshold, then an indication of potential need for maintenance is displayed or transmitted. Such a method is taught, for example, in U.S. Pat. No. 7,683,642, issued Mar. 23, 2010. One limitation of this technique is that it can require extra elements to carry out the resistance measurement, thereby adding material cost and manufacturing complexity.

It is also known to monitor the temperature of the sockets and jaws of the meter for overheating. The detection of an overheat condition in the sockets and jaws of the meter can indicate an arcing condition, or other condition, such as increased resistance, requiring maintenance. Such a method is discussed, for example, in U.S. Pat. No. 7,513,683. This method, however, requires that the temperature sensing device be attached to a mass in thermal contact with the electrical connection. This technique, though simple, cannot be applied in meter designs where the temperature sensing device is isolated from the electrical connection by some sort of significant insulator, such as an air gap. In such meter designs, the measured temperature can be distorted to a significant extent by ambient temperature and other normal operations within the meter. As a consequence, the threshold must be high enough to avoid false positives due to other conditions causing a temperature rise in and around the meter blades.

Another known method of detecting the presence of arcing or other meter blade/socket malfunction includes monitoring RF noise within the meter. In particular, arcing between the meter blades and the meter socket causes emission of certain RF noise that may be monitored. Such a method is described in U.S. Patent Publication No. 2014/0327449. Such a solution, however, cannot readily distinguish arcing from other sources of RF noise. Thus, sometimes such a method includes monitoring other meter phenomena, such as internal temperature, so that multiple phenomena can confirm the condition. However, such a solution requires an RF receiver and has the complexity associated with monitoring multiple factors to determine if arcing is present.

Thus, a continuing need exists to detect possible issues due to deterioration of high-power switch contacts in a meter or a meter socket that can reliably and efficiently determine the presence of a maintenance issue.

BRIEF SUMMARY OF THE INVENTION

Different embodiments described herein address the above-cited need, as well as others, by using a compensated temperature measurement to determine if an overheat condition exists. Moreover, other embodiments determine whether a measured temperature (with or without compensation) is outside of normal ranges based on the time of year and the time of day.

A first embodiment is a utility meter that includes a meter housing that supports at least one current coil, a temperature sensor, and a processing circuit coupled to both. The current coil can be coupled to receive heat energy from a meter socket. The temperature sensor disposed generates a sensor signal based on a temperature within the meter housing. The processing circuit obtains the sensor signal and generates meter temperature information based at least in part thereon. The processing circuit also obtains a first predetermined threshold based on at least one of time of day information and date information. The processing circuit also determines whether an abnormal condition exists by comparing the meter temperature information to a value based on the first predetermined threshold, and generates an output signal to a memory, display or communication circuit responsive to determining that the abnormal condition exists.

The above-described features and advantages, as well as others, will become more readily apparent to those of ordinary skill in the art by reference to the following detailed description and the accompanying drawings.

DETAILED DESCRIPTION OF THE INVENTION

Figure 1:
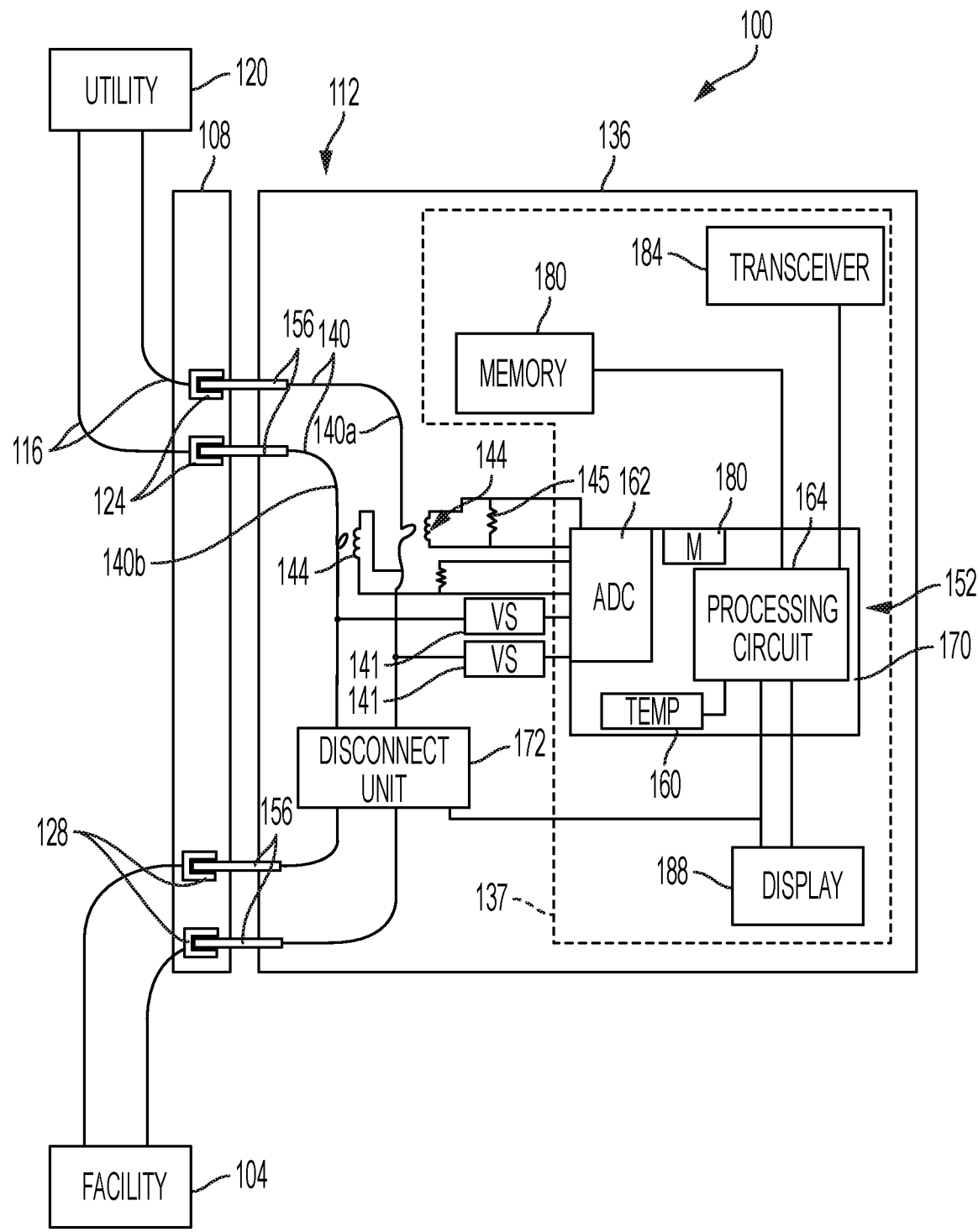
FIG. 1 shows a schematic block diagram of a metering system for a facility that includes a mounting device and a utility meter.

For the purpose of promoting an understanding of the principles of the disclosure, reference will now be made to the embodiments illustrated in the drawings and described in the following written specification. It is understood that no limitation to the scope of the disclosure is thereby intended. It is further understood that this disclosure includes any alterations and modifications to the illustrated embodiments and includes further applications of the principles of the disclosure as would normally occur to one skilled in the art to which this disclosure pertains.

As shown in FIG. 1, a metering system 100 for a facility 104 includes a mounting device 108 and a utility meter 112 associated with electrical power distribution lines 116 that distribute electrical energy from a utility 120. In the exemplary arrangement of FIG. 1, the mounting device 108 includes two line-side sockets 124 electrically connected to the distribution lines 116, and two load-side sockets 128 electrically connected to the facility 104. The sockets 124, 128 are formed from metal and are configured to withstand high currents and voltages. In other embodiments, the mounting device 108 includes any suitable number of sockets 124, 128 formed from any suitable material.

The utility meter 112 includes a housing 136, at least one primary coil or current coil 140 (two shown in FIG. 1), at least one secondary coil 144 (two shown in FIG. 1), at least one voltage sensor 141 (two shown in FIG. 1), a temperature sensor 160, and a metrology circuit 152. In this embodiment, the utility meter 112 also includes memory 180, a transceiver 184, and a display 188. The housing 136 is an electricity meter housing, as is known in the art, which supports and protects meter components from tampering and harmful environmental conditions. In this embodiment, the voltage sensors 141, the secondary coils 144 and memory 180, the transceiver 184, the display 188 and the metrology circuit 152 are all contained within an interior of the housing 136. Preferably, a printed circuit board 137 supports the memory 180, the transceiver 184, the display 188 and the metrology circuit 152. The printed circuit board 137 is spaced apart from the high current components, i.e., the current coils 140, by at least two inches.

The current coils 140, also referred herein to as primary coils 140, are electrical conductors (e.g. copper conductors) that are located at least partially within and supported by the housing 136. The current coils 140 each include two blades 156, which are configured to partially extend from the housing 136. The blades 156 are configured to provide a mechanically and electrically sound connection between the current coils 140 and the sockets 124, 128. Specifically, the blades 156 are configured to be received by the sockets 124, 128 to operably connect the current coils 140 to the sockets such that electrical current may be transferred through the utility meter 112. In other words, the electrical current drawn by the facility 104 passes through the current coils 140 when the blades 156 are received by the sockets 124, 128. In addition, the current coils 140 and the blades 156 may also mechanically support the meter 112 in a mounted position (as shown in FIG. 1) on the mounting device 108. Also, heat energy generated within or on the sockets 124, 128 is transferred to the current coils 140 through the blades 156, since the current coils 140 and the blades 156 are typically formed from metal and are positioned in contact with the sockets 124, 128.

The secondary coils 144, which may suitably be part of a so-called current transformer, are disposed in a current sensing relationship with respect to the current (primary) coils 140. As is known in the art, a current transformer includes at least one secondary coil (e.g. the secondary coils 144) wrapped about a toroidal core, not shown. At least one of the primary coils 140 passes through the center of the toroidal core. Accordingly, the primary coils 140 and the secondary coils 144 are configured as an electrical transformer. Regardless of the specific embodiment, the secondary coils 144 are configured to generate a scaled down version of the current passing through the primary coils 140. Each of the secondary coils 144 is operably coupled, e.g. through a corresponding burden resistor 145, to provide a current measurement signal representative of the current passing through the primary (or current) coils 140 to the metrology circuit 152.

The voltage sensors 141, each of which may suitably comprise a resistive divider, are disposed in a voltage sensing relationship with respect to the current coils 140. The voltage sensors 141 are configured to generate a scaled down version of the line voltage on the current coils 140, which is representative of the voltage delivered to the load. The voltage sensors 141 are operably coupled, to provide a voltage measurement signal representative of the voltage on the current coils 140 to the metrology circuit 152.

The metrology circuit 152 is any suitable circuit(s) configured to generate metering data or consumption data by detecting, measuring, and determining one or more electricity and/or electrical energy consumption values based on electrical energy flowing from the line-side sockets 124 to the load-side sockets 128. Specifically, the metrology circuit 152 uses at least the voltage measurement signal and the current measurement signal to determine the metering data. The utility 120 typically accesses the metering data for billing purposes as well as other purposes.

In this embodiment, the metrology circuit 152 includes an analog-to-digital converter ("ADC") 162, a processing circuit 164, all packaged within a single integrated circuit ("chip") package 170. The integrated circuit package 170 may also include all or part of the memory 180. In general, the ADC 162 is operably coupled to receive the voltage measurement signals from the voltage sensors 141, and to generate digital voltage measurement signals therefrom. The ADC 162 is likewise operably coupled to receive the current measurements signals from the secondary coils 144 and generate digital current measurement signals therefrom.

The processing circuit 164 includes one or more processing devices and accompanying support circuitry, configured to carry out program operations and processing. The processing circuit 164 is operably coupled to receive the digital voltage and current measurement signals from the ADC 162, and is programmed and/or otherwise configured to generate metering information therefrom. For example, the processing circuit 164 may suitably use known computational methods to determine energy consumption (e.g. kw-hrs, VARS, etc.) using the digital voltage and current measurement signals. The processing circuit 164 also executes software instructions to perform control operations, and other operations described hereinbelow. The processing circuit 164 is operably connected to receive the software instructions from the memory 180.

With reference still to FIG. 1, the temperature sensor 160 is a sensor device and accompanying circuit that are configured to generate a sensor signal based on a temperature within the meter housing 136. The temperature sensor 160 is configured to provide the sensor signal to the processing circuit 164. To reduce manufacturing costs, the temperature sensor 160 can be disposed on or supported by the printed circuit board 137. Specifically, in this embodiment, the temperature sensor 160 is included in the integrated circuit package 170 in which the processing circuit 164 is disposed. Examples of commercially available meter processing packages that include a suitable processing circuit and temperature sensor include the model 71M6513, 71M6521, and 71M6533 metering ICs available from Silergy Corp.

In particular, since the current coils 140 and the sockets 124, 128 are configured to conduct heat energy, the current coils 140 have a temperature that is in part based on the temperature of the sockets 124, 128. The current coils 140 are largely disposed within the interior of the meter housing 136, and thus heat conveyed from the sockets 124, 128 cause the temperature within the meter housing 136 to rise. Consequently, the temperature sensor 160 is configured to indirectly sense the temperature within or on the sockets 124, 128 by sensing the temperature within the meter housing 136.

Because the temperature sensor 160 in this embodiment is located on the circuit board 137 away from current coils 140 and blades 156, the measurement of the temperature sensor 160 less directly reflects heat generated within the connection between the meter jaws 124, 128 and the meter blades 156. To this end, normal operational heat of the metrology circuit 152, as well as environmental heat (weather), and other factors can affect the temperatures within the meter housing 136. Accordingly, the processing circuit 164 in this embodiment is configured to determine a temperature adjustment value that is intended to approximate the ambient heat or meter self-heating, or in other words, heat that is present due to factors other than a malfunctioning connection between one or more of the sockets 124, 128 and blades 156.

In general, the temperature adjustment value is calculated based on the current passing through current coils 140, and includes a constant value that approximates the self-heating of the metrology circuit 152. As will be discussed below in detail, the processing circuit 164 is further configured to process the temperature adjustment value using an infinite impulse response filter (or other low pass filter), to account for the fact that changes in current do not immediately result in temperature change. As will also be discussed below in detail, the processing circuit 164 is further configured to determine if the difference between the temperature sensor value and the temperature adjustment value, which approximates heating due to abnormal conditions, exceeds a threshold, thus indicating a heat-generating malfunction.

With continued reference to FIG. 1, the utility meter 112 in this embodiment further includes an optional disconnect unit 172. The disconnect unit 172 is operably coupled to the current coils 140 and the metrology circuit 152 and is configurable in a closed state (first state) and an open state (second state). In the closed state, a closed circuit is formed in the current coils 140, which enables electrical power transfer from the utility 120 to the facility 104 (i.e. the load) through the distribution lines 116. In the open state, an open circuit is formed in the current coils 140, which prevents electrical power transfer from the utility 120 to the facility 104 through the distribution lines 116. Specifically, in the open state electrical current is prevented from flowing from the line-side sockets 124 to the load-side sockets 128. The disconnect unit 172 includes a relay or any other suitable device that controllably disconnects and re-connects electrical power to the facility 104. Because the disconnect unit 172 contains switch contacts, not shown, that carry the full load current to the facility 104, such contacts can also degrade to a point at which they create excess heat within the meter housing 136. Any overheat conditions caused by degradation of the disconnect unit 172 will also be detected by the sensor 160 and processing circuit 164 performing the operations described herein.

Moreover, as described below, the metrology circuit 152 may be configured to control the state of the disconnect unit 172 based on the detection of overheat conditions within the meter housing 136.

The memory 180 is operably coupled to the processing circuit 164 and is configured to store metering data generated by the metrology circuit 152. The memory 180 may include separate devices within or external to the integrated circuit package 170. Additionally, the memory 180 is configured to store look-up tables and program data for operating the temperature sensor 160 and the processing circuit 164 according to the methods described herein, as well as storing any other electronic data used or generated by the metrology circuit 152. The memory 180 is a non-transitory machine readable storage medium. While the memory 180 is shown in the drawing as being external to the integrated circuit package 170, the memory 180 shall be considered to encompass data and program storage both internal to and external to the integrated circuit package 170. In a preferred embodiment the data values discussed below in connection with FIGS. 3 through 8 may be programmed externally, through the transceiver 184, to allow for the values to be location-specific, as well as meter-configuration specific.

The transceiver 184 is operably coupled to the processing circuit 164 and is configured to send electric data to the utility 120 and/or to an external unit (not shown), and to receive electric data from the utility and/or the external unit. In one embodiment, the transceiver 184 is a radio frequency ("RF") transceiver operable to send and to receive RF signals. In another embodiment, the transceiver 184 includes an automatic meter reading (AMR) communication module configured to transmit data to an AMR network and/or another suitable device. The transceiver 184 may also be configured for data transmission via the Internet over a wired or wireless connection. In other embodiments, the transceiver 184 is configured to communicate with an external device or the utility 120 by any of various means used in the art, such as local optical communications, power line communications, telephone line communications, or other means of communication.

The display 188 is operably coupled to the processing circuit 164 and is configured to display data associated with the utility meter 112 in a visually comprehensible manner. For example, the display 188 may be configured to display consumption data, the state of the disconnect unit 172, and the sensed temperature within the meter housing 136, for example. The display 184 may be any suitable meter display device, such as a liquid crystal display unit, for example.

In operation, the metering system 100 operates to measure and quantify electrical energy provided to the facility 104 from the utility 120 via the power distribution lines. To this end, line voltages and line currents flowing from the distribution lines 116 to the facility 104 pass through the sockets 124 and blades 124 to the current coils 140a, 140b. The secondary coils 144 detect the line currents and generate scaled down versions of the line current on the current coils 140a, 140b. The secondary coils 144 provide to the ADC 162, via corresponding burden resistors 145, a current measurement signal representative of the current passing through each of the current coils 140a, 140b. The voltage sensors 141 obtain the line voltage from each of the current coils 140a, 140b, and generate a scaled down version of each line voltage, which is representative of the voltage signals delivered to the load. The voltage sensors 141 are operably coupled to provide a voltage measurement signal representative of each of the line voltages to the ADC 162.

The ADC 162 digitizes the voltage and current measurement signals to generate streams of samples (digital waveforms) having values approximating the voltage and current measurement signals. The ADC 162 provides the digital voltage and current measurement signals to the processing circuit 164.

Figure 2:
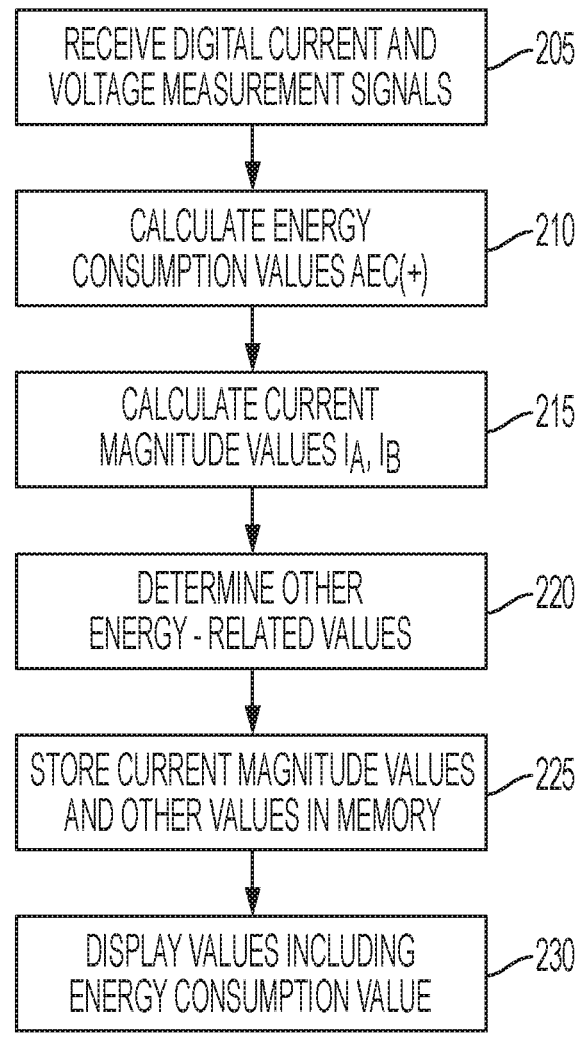
FIG. 2 shows an exemplary set of operations carried performed by the processing circuit of the meter of FIG. 1 to generate metering information.

The processing circuit 164 uses the digital voltage and measurement signals to generate the metering data. Such metering data can includes and accumulated energy consumption value (e.g. kw-hrs, VARS, etc.), RMS voltage values, RMS current values, and instantaneous energy values, among other things. To this end, the processing circuit 164 in this embodiment performs the operations of FIG. 2. It will be appreciated that many other types of operations and calculations may be performed in addition to those in FIG. 2, and not all of the calculations of FIG. 2 need be performed to carry out at least some embodiments of the invention.

In step 205, the processing circuit 164 receives digital voltage and current measurement values (e.g. samples) for the current time, t. In step 210, the processing circuit 164 calculates at least one energy consumption value, for example, accumulated value AEC(t) as a function of the previous value, AEC(t−1), and the newly received digital voltage and current measurement values. Various sample-based energy and power calculations are known to those of ordinary skill in the art. For example, it is not known to multiply contemporaneous voltage and current samples, and to accumulate the totals over time.

In step 215, the processing circuit 164 generates one or more current magnitude values representative of the magnitude of current flowing through the current coils 140. For example, the processing circuit 164 can generate root-mean-square ("RMS") current calculations for each of the current coils 140a and 140b. For example, the value IA may suitably be the RMS current for the current detected on the current coil 140a at time t, and the value IB may suitably be the RMS current for the current detected on the current coil 140b at time t. The processing circuit 164 generates such RMS values in any traditional manner based on the samples of the digital current measurement signal from the prior several AC cycles of the line current. For example, in a 60 Hz system, the samples for the last one second cover sixty AC cycles, and thus provide a reasonable RMS voltage calculation. Fewer or more samples maybe used. It will be appreciated that step 215 need not be performed every time the energy consumption value AEC(t) is updated in step 210. It may be sufficient to update the current measurement values every second, every few seconds, or even every minute or longer.

In step 220, the processing circuit generates other energy-related values, which can include RMS voltage per line, and/or power factor related values. The calculation and use of such values would be known to those of ordinary skill in the art.

In step 225, the processing circuit 164 stores the current magnitude values in the memory 180, and may also store in the memory 180 any of the values generated in steps 210 or 220. In particular, because meter 112 includes two current sensors, the processing circuit 164 may suitable calculate and store the two current magnitude values IA and IB in step 225. In steps 230, the processing circuit 164 causes the display 188 to display one or more of the values calculated in steps 210, 215 or 220. Typically, the processing circuit 164 will cause the display to display the energy consumption value AEC(t) generated in step 210. It will again be appreciated that steps 225 and 230 need not be executed every time a new energy consumption value is calculated.

In addition to such ongoing functions, the processing circuit 164 can contemporaneously perform other tasks. In this embodiment, the processing circuit 164 performs a heat monitoring routine that determines whether there is a heat-related issue with the meter 112, such as from arcing between any of the sockets 124, 128 and any of the meter blades 156.

Figure 3:
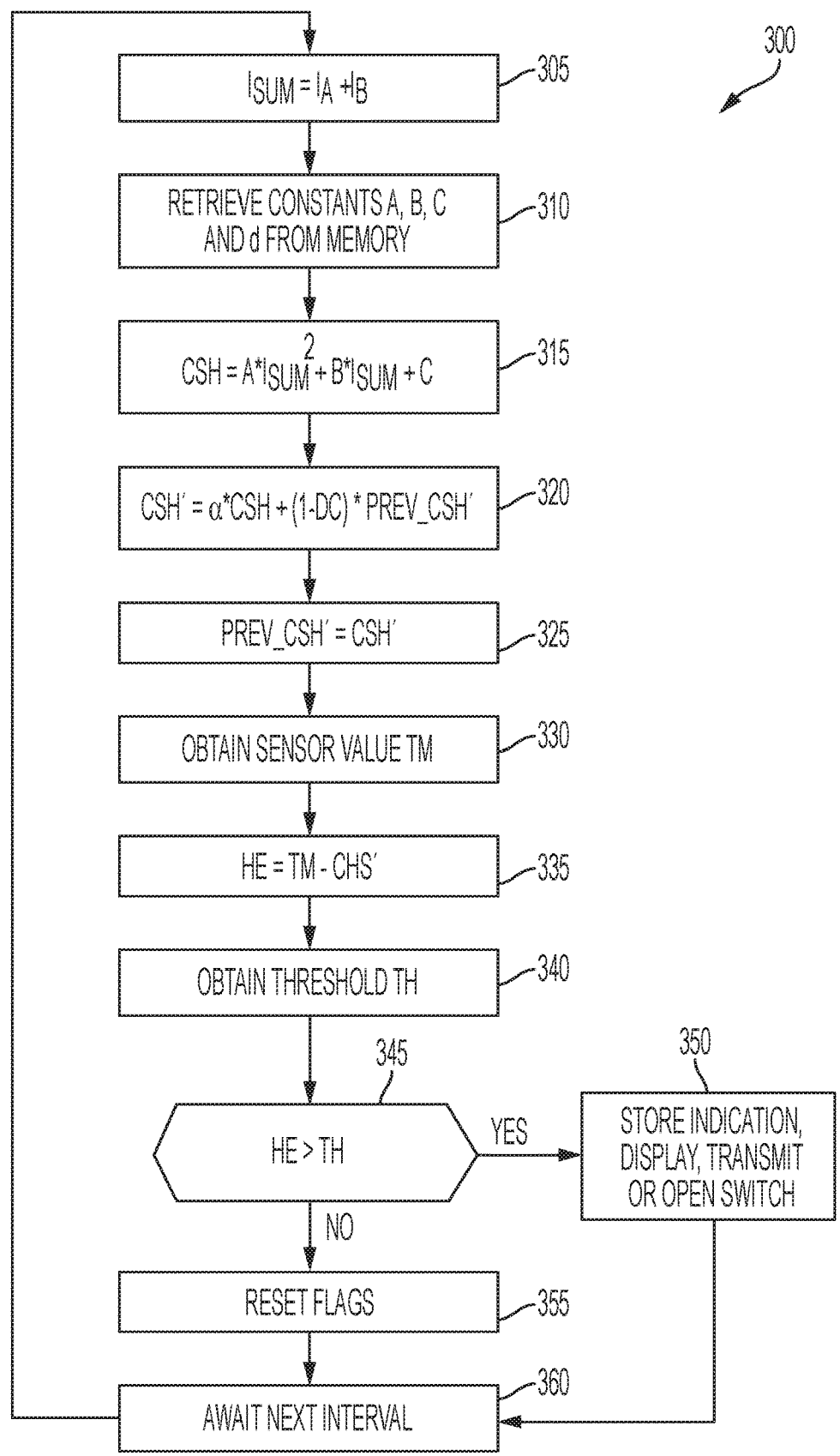
FIG. 3 shows a flow diagram of an exemplary meter heat monitoring routine that may be performed by the processing circuit of the meter of FIG. 1.

FIG. 3 shows a flow diagram of an exemplary meter heat monitoring routine 300 that may be performed by the processing circuit 164. As is known in the art, the processing circuit 164 may be contemporaneously perform other steps of other routines, such as those of FIG. 2, while executing the steps of monitoring routine 300. The processing circuit 164 is preferably configured to execute the routine 300 at regular intervals t, such that each iteration a predetermined time period from the previous iteration. An exemplary interval may be within the range of t=0.1 seconds to 1.0 second.

In step 305, the processing circuit 164 obtains at least one current magnitude value $I_{SUM}$ that is representative of the sum of the current magnitudes through the current coils 140a, 140b.

In the embodiment described herein, the processing circuit 164 obtains the most recently stored RMS current values IA and IB (see step 215, discussed above) from the memory 180. The processing circuit 164 then adds the two numbers together to yield $I_{SUM}$. In other words, the processing circuit 164 performs the following calculation: $I_{SUM}$=IA+IB. Alternatively, other values representative of the total current magnitude delivered through the current coils 140a, 140b may be used. It will be appreciated that in an embodiment in a three-phase meter having three current coils, the processing circuit 164 would obtain a value representative of the sum of the current magnitudes in all three current coils.

In step 310, calculation constants A, B, C, and a are retrieved from the memory 180. The calculation constants A, B, and C represent the coefficients of the equation that models the self-heating temperature component of the meter 112. In accordance with the embodiments described herein, the self-heating temperature value, CSH, is a measure of the internal heating of the meter that occurs due to normal meter operations. As will be discussed below, the value CSH is calculated using the generalized equation:

$$CSH=A*I_{SUM}^2+B*I_{SUM}+C \qquad (1)$$

As will be discussed below, the self-heating temperature value CSH is used as an adjustment to the measured temperature to yield an approximation of the heating within the meter 112 that is due to abnormal conditions, as opposed to normal internal self-heating. In this embodiment, the value CSH is furthermore filtered to account for the time lag between current swings and the corresponding temperature change in the current coils 140. The value a is a coefficient for that filter, which is in the form of an infinite impulse response filter.

As can be seen in equation (1), the self-heating within the meter 112 includes a portion that is dependent on load current ($I_{SUM}$), and a portion that is independent of load current. To this end, normal self-heating occurs due to load current flowing through the current coils 140, and other factors, such as the operation of the processing circuit 164 and/or communications circuits. The portion of self-heating due to load current has been found in one typical type of meter to be 0.1° to 0.15° C./amp, with an exponential increase after the current reaches 160 amps. These values will vary from meter to meter and may be determined empirically.

The value of A represents the exponential coefficient, and therefore will be well below unity for temperatures below that which the self-heating becomes exponential with current. Thus, the example where the current increases exponentially after 160 amps, the value A should be below 1/160 or 0.00625, assuming the value of CSH is in amps. The value of B, however, represents the proportional portion of the load current based-self heating, and therefore will in the range 0.1 to 0.15, assuming the value of CSH is in amps.

The value of C is not related to load current, and represents an approximation of all other normal self-heating within the meter 112. Such other self-heating will be present even when little or no current is flowing through the current coils 140a, 140b. It has been found that the load current independent self-heating in one exemplary meter is in the range of 4° C. to 10° C.

The values of A, B, and C can be determined empirically for every meter configuration. In particular, temperature readings can be taken from the temperature sensor 160 at various load current levels, in a facility with a known ambient (environmental temperature). The load current would presumably be applied through the current coils 140a and 140b in a controlled condition with properly conducting electrical contacts. Each temperature reading should be taken after a delay from the application of the load current in order to ensure that the steady-state temperature is reached for each load current level. The differences between the temperature readings and the known ambient temperature would then be plotted as a function of load current level. Traditional curve-fitting techniques can be used to develop the best fit coefficients A, B, C for the function $CSH=A*I_{SUM}^2+B*I_{SUM}+C$.

The value of a is the decay factor of the IIR filter. The filter many suitably have the form of:

$$CSH'=\alpha*CSH+(1-\alpha)*PREV\_CSH', \qquad (2)$$

where n is the index, discussed above, that is incremented each time the routine 300 are executed. In general, a represents the decay factor for increasing or decreasing heat radiated by the current coils 140a, 140b responsive to a change in current. For example, a current coil that transitions from carrying only one (1) amp to carrying one hundred sixty (160) amps will not have the same temperature immediately as it will if it remains at one hundred sixty (160) amps for twenty minutes. The value of a will vary based on the physical characteristics of the current coils 140a, 140b, and the time period between successive executions of the routine 300. The factor α may also be determined empirically by applying transitions in load current and taking temperature measurements at various intervals after the transition.

It will be appreciated that in lieu of retrieving the values A, B, C, and a separately from memory 180, the values may be embedded within the actual software executed by the processing circuit 164, for example, when carrying out the calculations of steps 315 and 320 below. It will be appreciated that such program itself would be stored in the memory 180, and thus that the values A, B, C, and a would thus be stored in the memory 180 either way. However, the embodiment described herein stores the values A, B, C, and α in a table in the memory 180 separate from the software code to promote flexibility. For example, separate storage of the values A, B, C, and a can allow the same software program to be used in meters that may have different features, and thus different constants A, B, C, and α.

In any event, after obtaining the values A, B, C, and a in step 310 in this embodiment, the processing circuit 164 proceeds to step 315. In step 315, the processing circuit performs the calculation to obtain the raw adjustment value CSH for the current iteration. As discussed above, this value is equal to:

$$CSH=A*I_{SUM}^2+B*I_{SUM}+C, \qquad (1)$$

The value CSH represents the steady-state self-heating adjustment if the current remained at the level $I_{SUM}$ for a long period of time.

Thereafter, in step 320, the processing circuit 164 filters the steady state self-heating estimate CSH through the IIR filter of equation (2), or $CSH'=\alpha*CSH+(1-\alpha)*PREV\_CSH'$. The resulting value CHS' represents the estimate of the current measure of self-heating within the meter 112 under normal conditions, for example, when there is no arcing in the blades 156 and/or sockets 124, 128, nor any other heat-generating malfunction. The self-heating estimate CSH' is useful because it makes it easier to determine whether a heat-generating malfunction is present more accurately, particular when the temperature sensor 160 is located away from the current coils or blades 140, for example, on the printed circuit board 137, or within the integrated circuit chip 170 itself.

In step 325, the processing circuit 164 stores the current CSH' value as the value PREV_CSH' for use in step 320 in the subsequent iteration of the steps 300. The processing circuit 164 in step 330 obtains the current temperature sensor value TM from the temperature sensor 160. As discussed above, the value TM will be influenced by the current ambient (external environmental) temperature ET, the meter self-heating under normal conditions CSH', and any heat generating malfunction.

In step 335, the processing circuit 164 adjusts the temperature sensor value TM by subtracting out the value CSH'. The resulting temperature value HE represents the measured temperature, with the estimated self-heating (for normal operations) removed. Thus, under normal conditions, the temperature value HE should be close to the ambient temperature ET. As such, any significant difference between HE and ET can indicate a heat-generating malfunction within the meter 112, or in or on the meter blades 156.

In step 340, he processing circuit 164 obtains a threshold TH, which is a function of date and time, that identifies an overheating threshold. The overheating threshold TH is adjusted for time of day and seasonal temperature trends. Further detail on one useful embodiment for providing the threshold TH as a function of time and date is provided below in connection with FIGS. 4 through 8. In an alternative embodiment, if the processing circuit 164 can obtain the true local external temperature ET from an external (e.g. remote) source of temperature information, the value TH can be set to that value plus a predetermined buffer of a few degrees, ET+δ. In any event, after the processing circuit 164 obtains the threshold TH in step 340, the processing circuit 164 proceeds to step 345.

In step 345, the processing circuit 164 determines whether the value HE exceeds TH. If so, then the processing circuit 164 proceeds to step 350. If not, however, then the processing circuit 164 proceeds to step 355, discussed further below.

In step 350, the processing circuit 164 stores in the memory 180 an indication (e.g. an overheat flag) that a heat-generating anomaly or event has been detected. The indication may be stored within a predetermined position in a predefined data table, such that an external computing device communicating with the meter processing circuit 164 may receive the table data and determine the existence of the heat-generating event has been detected. Similarly, the processing circuit 164 may also cause the communication circuit 184 to transmit a signal indicating the event to an external device, such as a central computer monitored by the utility service provider. The processing circuit may also, or alternatively, cause the display 188 to display an indication of the event, and/or cause the service switch 172 to open, thereby interrupting the current through the meter 112. It is noted that it could be advantageous to require multiple detections of a heat-generating anomaly (i.e. in subsequent executions of the routine 300) before communicating the indication, displaying the indication, and/or opening the service switch 172.

In the present embodiment, the processing circuit 164 maintains two separate overheat flags indicating first and second levels of severity. To this end, FIG. 4 shows in further detail an exemplary set of operations that may be used as step 350 of FIG. 3.

Figure 4:
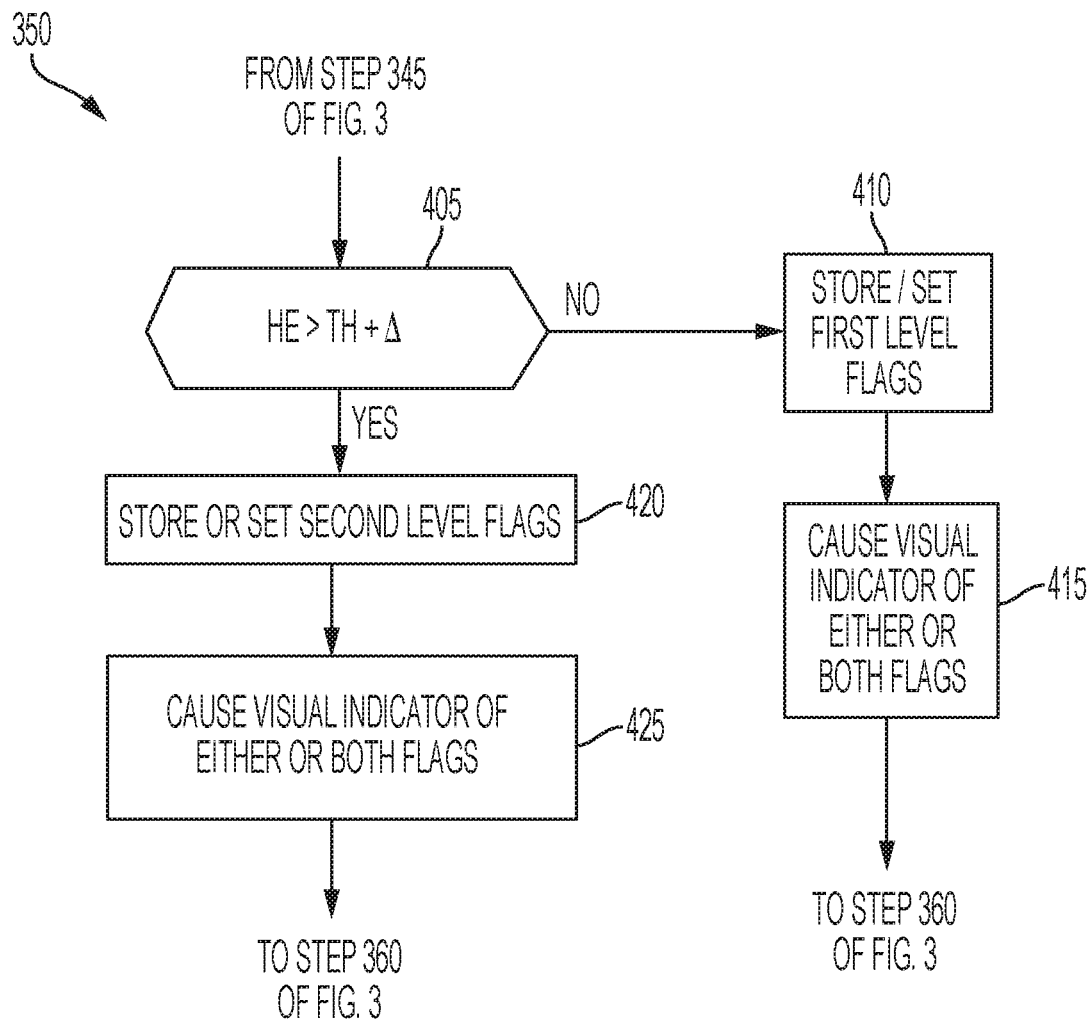
FIG. 4 shows in further detail an exemplary set of operations that may be performed as part of the meter heat monitoring routine of FIG. 3.

Referring to FIG. 4, the processing circuit executes step 405 as a result of the processing circuit 164 determining in step 345, that the HE>TH. In step 405, the processing circuit 164 determines whether HE>TH+Δ, where Δ represents the difference between a first level alarm (e.g. an "overheat warning"), and a second level alarm (e.g. an "overheat alarm"). If HE≤TH+Δ, then the processing circuit 164 proceeds to step 410. If, however, HE>TH+Δ, then the processing circuit 164 proceeds to step 420.

In step 410, the processing circuit 164 stores two first level alarm flags in the memory 180, e.g. "overheat warning" flags. One first level alarm flag is persistent, and can only be set once, and only reset by a technician. The other first level alarm flag is a present condition indicator, and can be reset at any time the condition is no longer present. This present condition indicator flag, for example, can be reset in step 355, discussed further below. Thereafter, in step 415, the processing circuit 164 causes a visual indication of the setting of the first level alarm flag(s) on the display 188. The processing circuit 164 thereafter returns to step 360 of FIG. 3.

By contrast, in step 420, the processing circuit 164 stores two second level alarm flags in the memory 180, e.g. "overheat alarm" flags. One second level alarm flag is persistent, and can only be set once, and only reset by a technician. The other second level alarm flag is a present condition indicator flag, similar to the first level present condition indicator flag, discussed above in connection with step 410. Thereafter, in step 425, the processing circuit 164 causes a visual indication of the setting of the second level alarm flag(s) on the display 188. The processing circuit 164 may also open the service switch 172, or cause communication of the presence of the condition by the transceiver 184. The processing circuit 164 thereafter returns to step 360 of FIG. 3.

As discussed above, the first and second level persistent flags can only be cleared by a process that involves interaction with a technician from the utility. Thus, the indication of either or both flags also persists until cleared by a utility technician.

Referring again to FIG. 3, step 355 occurs if is determined in step 340 that no overheat condition currently exists, or in other words, HE≤TH. The processing circuit in step 355 clears either or both of the present condition indicator flags set, if either had been set per steps 410 and 420. The processing circuit 164 thereafter proceeds to step 360.

In step 360, the processing circuit 164 completes the routine 300. After a predetermined time, the processing circuit 164 returns to step 305 re-execute the routine 300 for the next time period interval.

It will be appreciated that the value HE, which approximates the external ambient temperature under normal conditions, may be useful for other functions. For example, some meters perform a load-profiling operation in which energy usage and other values are stored for successive time increments (e.g. every 5 to 30 minute interval) to allow usage patterns and condition patterns to be analyzed. Some load-profiling operations also store ambient temperature, if available for each load profiling time interval. Thus, the processing circuit 164 in this embodiment may store the value HE, or an average of such a value, for each load profiling time interval (along with energy consumption and other information), the load profiling log stored in the memory 180. However, the processing circuit 164 may be configured to avoid storing the HE value if it exceeds the threshold TH, as that number would be influenced by overheating conditions.

It can thus be seen that the processing circuit 164 can use methods to allow a temperature sensor 160, which may be located some distance from the source of arcing or other heating anomaly, to detect an abnormal conditions that is timely adjusted for meter self-heating under normal conditions, and to otherwise approximate the external air temperature.

As discussed above, the threshold TH is preferably based on a current expected or real ambient temperature, plus a margin of a few degrees. For example, if the current ambient temperature ET(n) is known to be 20° C., then the threshold TH may be 25° C. As discussed above, the processing circuit 164 may be configured in some embodiments to receive current, accurate ambient temperature information from external sources via the communication circuit 184. However, if access to the real ambient temperature ET(n) is not available, then the threshold TH should be set to a maximum expected ambient temperature.

In a very simple case, a single threshold TH for the maximum temperature may be used. Thus, for example, the threshold of 65° C. may be used in moderate climates, due to sunlight loading. However, using a single threshold is disadvantageous because for most of the year, average temperatures are far below 65° C., particularly at night. As a result, it will take more potentially damaging internal overheating to cause the HE(n) to exceed TH.

To address this issue, one embodiment of the invention employs a threshold TH that is a function of time and date. In this embodiment, the processing circuit 164 maintains a real-time clock and calendar, as is well-known in the metering art. The processing circuit 164 obtains a threshold TH that is based on a maximum expected temperature for the date, and for that date, the maximum expected temperature for the time of day. In this embodiment, the threshold TH is selected from a set of stored thresholds $TH_{M,D}$, each corresponding to a combination M,D of a time of year M and a time of day D. In this embodiment, the set of stored thresholds $TH_{M,D}$ include two estimated maximum temperature thresholds (night and day) for each month of the calendar year. Thus, the memory 180 stores twenty-four values $TH_{M,D}$, with two thresholds, D=0 (night) and D=1 (day) for each month M=1 to 12.

By way of example, at 12:08 pm on February 4th, the processing circuit 164 in step 340 would retrieve as the threshold TH the value $TH_{2,1}$ from memory. At 11:30 pm on July 18$^{th}$, the processing circuit 164 would retrieve as the threshold TH the value $TH_{7,0}$. In addition, in the embodiment described herein, the memory 130 further stores an additional threshold, $TH_{0,0}$, that is used if the time and date is not presently available (e.g. due to a recent power interruption or meter restart).

Figure 5:
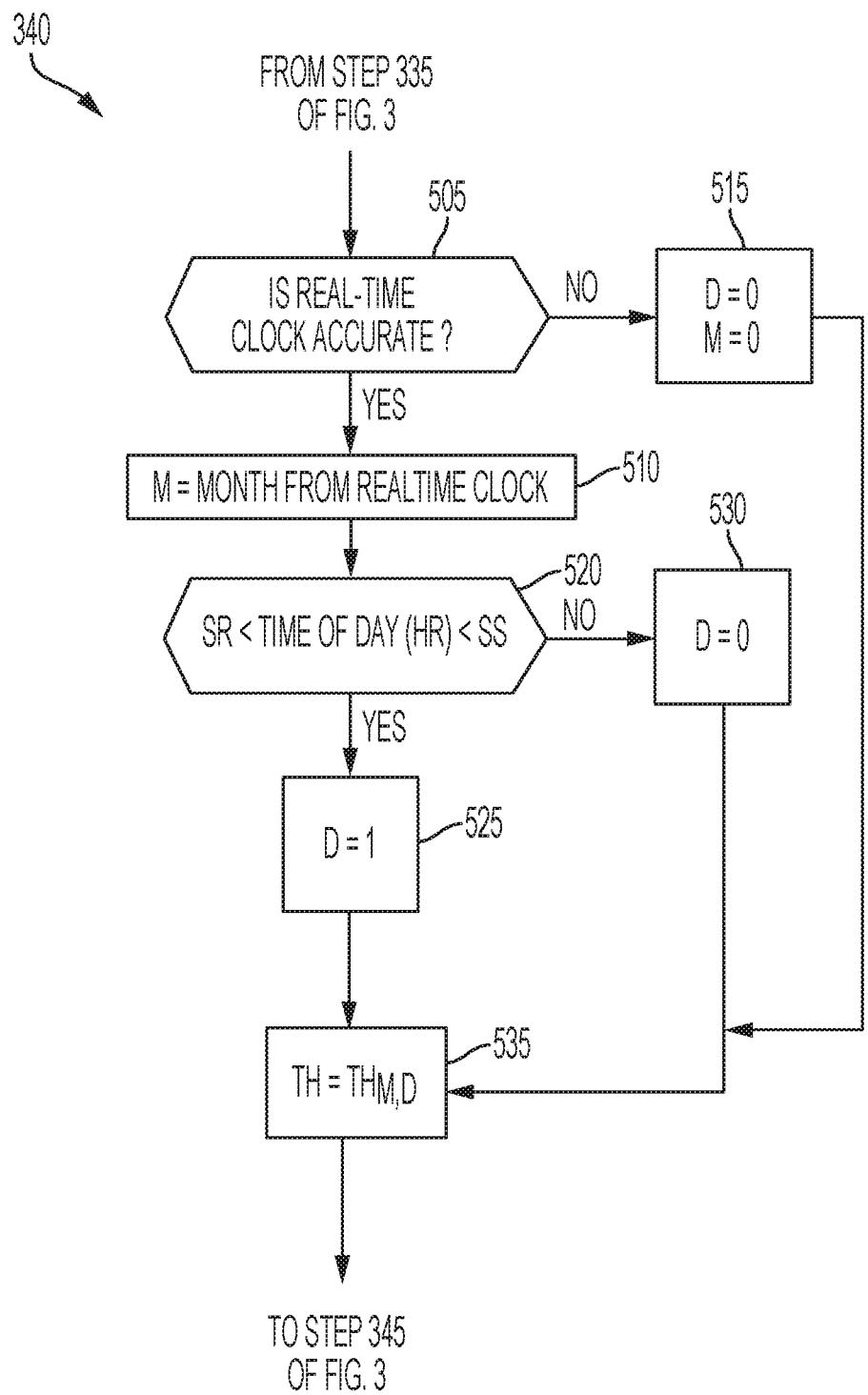
FIG. 5 shows in further detail an exemplary set of operations that may be performed as another part of the meter heat monitoring routine of FIG. 3.

In this embodiment, step 340 of FIG. 3 may be carried out as illustrated by the operations of FIG. 5. Referring to step 5, the processor 164 in step 505 determines whether the real-time clock has a sufficiently accurate value. As discussed above, the processor 164 and/or other circuits are configured to maintain the real-time clock (including date) during normal meter operation and even during most power outages. However, there are conditions in which the processor 164 loses the real-time clock, such as during very long power outages or other malfunctions. The processor 164 will store a value or flag indicative of a failure/loss of the real-time clock. If the processor 164 in step 505 determines that the real-time clock has a sufficiently accurate value, then the processor 164 proceeds to step 510. If, however, processor 164 in step 505 determines that the real-time clock does not have a sufficiently accurate value, then the processor 164 proceeds to step 515.

Referring now to step 510, the processor 164 retrieves as M the month value from the real-time clock. Thereafter the processor 164 in step 520 determines whether the time of day is in or around daylight hours, for example, between 6:00 am and 9:00 pm. In this embodiment, the real-time clock employs a twenty-four hour format. Thus, the processor 164 determines in step 520 whether the hour value HR is greater than a sunrise time value SR, but less than a sunset time value SS. The values SR and SS may be constant, but preferably vary as a function of date, as the number of daylight hours varies throughout the year. If the values SR are based on date, then the memory 180 preferably stores values SR and SS that are also a function of date, for example, the month value M In such a case the processor 164 retrieves the values SR and SS from the memory 180 to carry out the operations of step 520.

If the processing circuit 164 determines that SR<HR<SS, then the processing circuit 164 sets the value D to 1 in step 525. If not, then processing circuit 164 sets the value D to 0 in step 530. After either of steps 525 or 530, the processing circuit 164 executes step 535. In step 535, the processing circuit 164 sets the threshold value TM equal to the array value $TM_{M,D}$. After step 535, the processing circuit 164 has completed step 340 of FIG. 3 and can proceed to step 345 as described above.

It will be appreciated, however, that other methods of employing the value $TM_{M,D}$ in the operations of FIG. 3 may be used.

Referring again to step 515, which occurs when the real-time clock is not accurate, the processor 164 sets both M and D to 0. The processing circuit 164 thereafter proceeds to step 535 to set TM=$TM_{0,0}$. The $TM_{0,0}$ value is preferably set to (or at least based on) the maximum temperature threshold in the array $TM_{M,D}$, to reduce the occurrences of false positives from ambient temperature.

Figure 6:
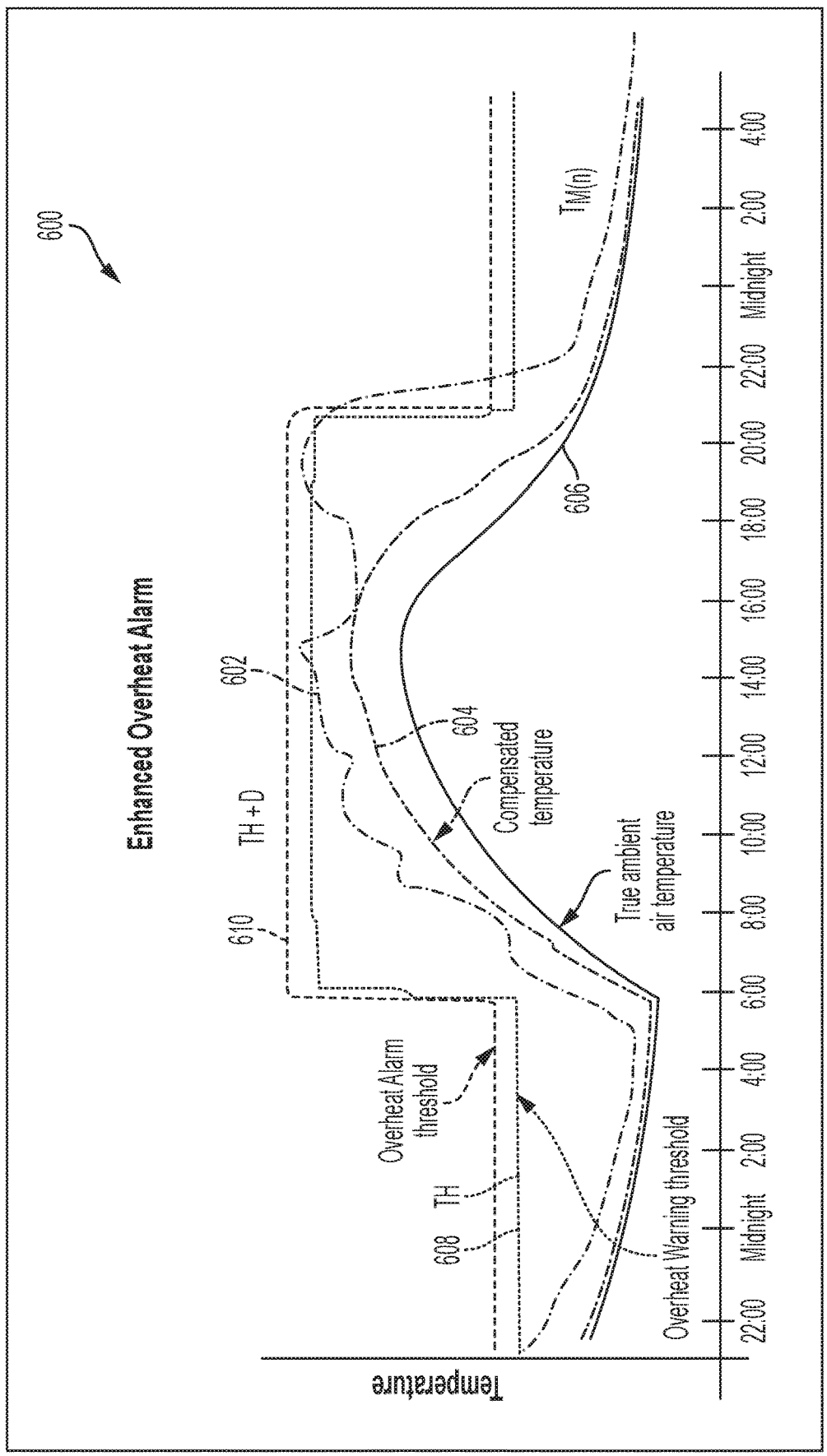
FIG. 6 shows an exemplary timeline of the values of a sample operation of the routine of FIG. 3.

FIG. 6 shows an exemplary timeline of the values of that occur in a sample operation of meter 112, which help illustrate the operations of the exemplary embodiment of FIGS. 3 and 5 described above. FIG. 6 shows a timeline graph 600 of temperature versus time over a twenty-seven (27) hour period in the month of July. The timeline values include the measured temperature value TM(n) generated by the temperature sensor 160 (line 602), the adjusted temperature HE generated in step 335 (line 604). and the true ambient temperature (e.g. environmental temperature) ET, which is not available within the meter 112 (line 606). The timeline values also include the first threshold value TH obtained in step 340 of FIG. 3 (line 608) and the second threshold value TH+Δ used in step 405 of FIG. 4 (line 610).

The values of FIG. 6 represent a time in which no heat was generated within the meter 112 due to malfunction or arcing in the current blade 156. In other words, the values of FIG. 5 illustrate a normal operation of the meter 112. As illustrated by the lines 602 and 606, the difference between the true ambient temperature (606) and the measured temperature (602) can vary significantly. This variance is due to the meter self-heating factors discussed further above. It is also noted that the differences are exaggerated in the late afternoon and early evening, for example, from about 6:00 pm (18:00) to 10:00 pm (22:00). Such exaggerated differences are likely due to elevated current usage, which tends to occur in the late afternoon or evening in residences, particularly in summer months. The elevated current usage increases the meter self-heating significantly, which is reflected in the value CSH of equation (1).

It is also noted that the measured temperature 602 has higher frequency (e.g. hourly) variance occurring at intervals, particularly during the day. Such high frequency variations can be due, for example, to temporary increases in current from devices that operate periodically.

As shown in FIG. 6, the compensated temperature HE line 504 does not in this embodiment exactly track the true ambient temperature line 506. This is due to the fact that some sources of error are difficult to predict. For example, sunlight loading can introduce, depending on the amount of cloud cover, a large degree of difference between the sensed temperature within the meter 112 and the external ambient temperature. In this embodiment, it has been determined that the increase in accuracy in the compensated temperature HE does not improve performance sufficiently to justify the increase in complexity necessary to achieve such accuracy. However, other embodiments can vary and account for different or additional factors to improve accuracy, if desired.

Nevertheless, it can be seen that the compensated temperature HE line 604 eliminates a large part of the error in the measured temperature TM line 606. Also, the compensated temperature HE line 604 does not reflect the higher frequency fluctuations in the measured temperature TM line 606, which further indicates that the fluctuations are due to periods of heavy current usage.

Referring to the first threshold value TH, the line 608 toggles between the daytime level $TH_{7,1}$ and the nighttime level $TH_{7,0}$. The second threshold value TH+Δ, the line 610 toggles between the daytime level $TH_{7,1}$+A and the nighttime level $TH_{7,0}$+A. It can be seen that the unadjusted measurement TM would exceed the threshold from the times of 21:00 to 22:00 causing a warning and alarm, if it were compared to the thresholds TH and/or TH+Δ, resulting a false event. In the prior art, the only way to avoid such false events would be to increase the thresholds significantly, which would be undesirable because a true arcing condition could take longer to detect.

In this embodiment, the threshold values TH can only have one of two values for a given day. However, in an alternative embodiment shown in FIG. 7, the threshold value line 708 has a trapezoidal shape, employing transition areas 712, 714 where the threshold varies between the values $TH_{7,1}$ and the nighttime level $TH_{7,0}$ as a function of time. In this case, the threshold value TH varies as a linear function of time in the transition areas 712, 714. The trapezoidal shape accommodates the transition areas between night and day to further improve the responsiveness to a relatively rapidly developing overheat situation. The upper threshold, TH+Δ, has the same shape, as indicated by line 710. This feature, combined with daylight transition time values SR and SS can create a robust overheat detection operation.

Figure 7:
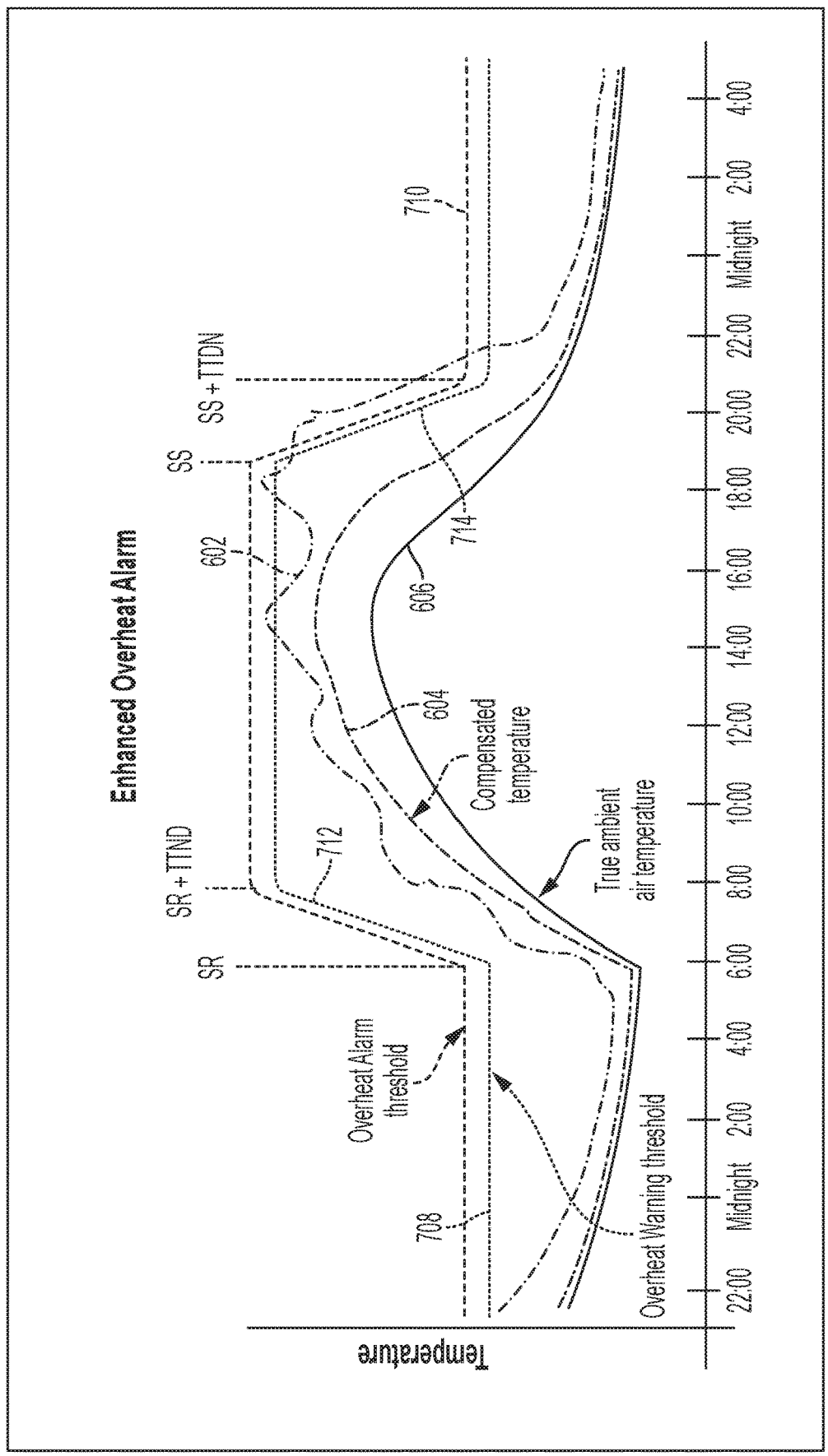
FIG. 7 shows an exemplary timeline of the values of a sample operation of an alternative embodiment of the routine of FIG. 3.
Figure 8:
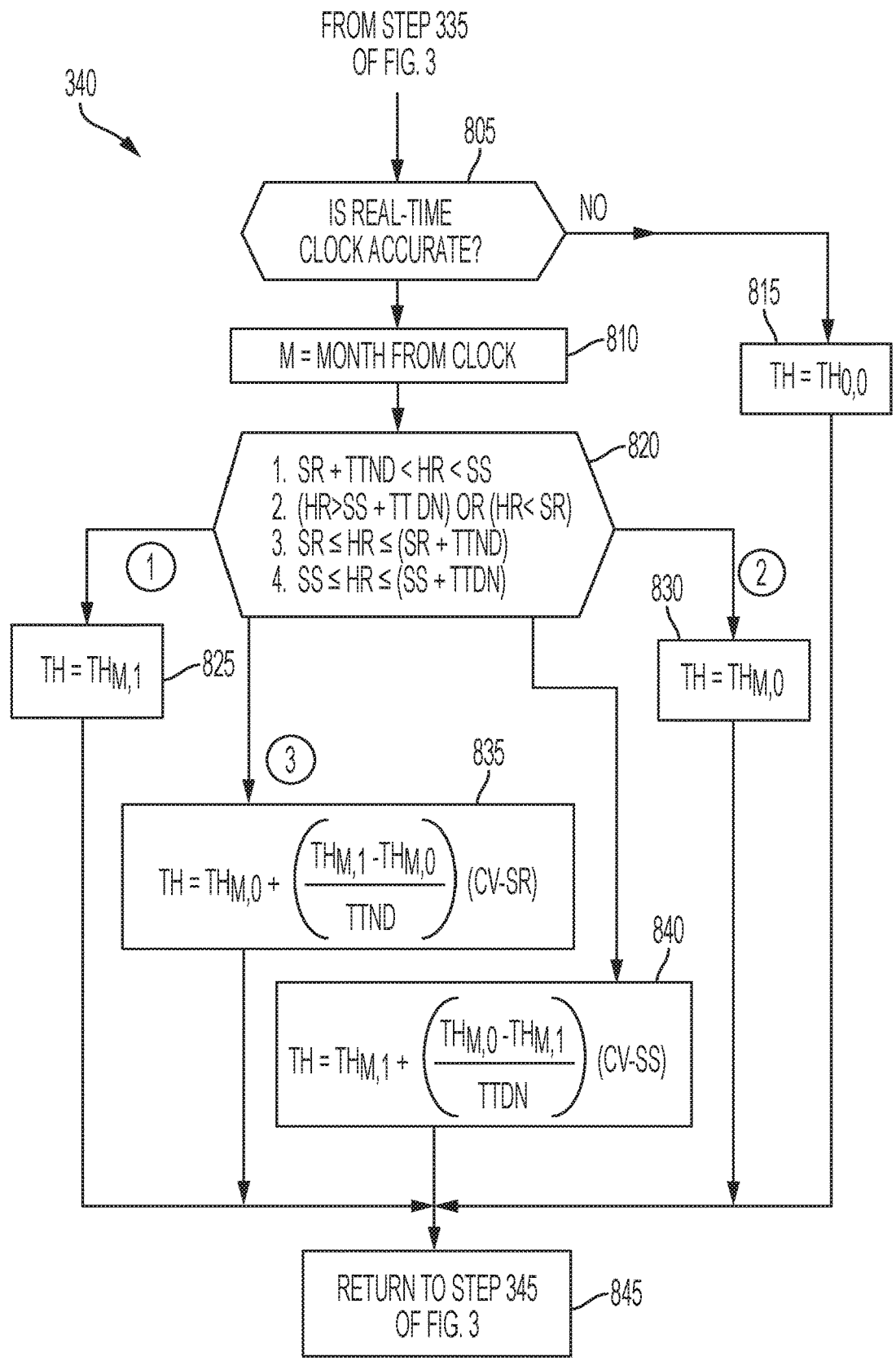
FIG. 8 shows in further detail an exemplary set of operations that may be performed as part of the alternative embodiment of the meter heat monitoring routine of FIG. 3.

FIG. 8 illustrates an alternative set of operations that can be used as step 340 of FIG. 3 to implement the trapezoidal shape threshold line 708 of FIG. 7. Referring to FIG. 8, the processing circuit 164 in step 805 determines whether the real-time clock has a sufficiently accurate value, as per step 505 of FIG. 5. If the processing circuit 164 determines that the real-time clock has a sufficiently accurate value, then the processing circuit 164 proceeds to step 810. If, however, the processing circuit 164 determines that the real-time clock does not have a sufficiently accurate value, then the processor 164 proceeds to step 815.

Referring now to step 810, the processor 164 retrieves as M the month value from the real-time clock. Thereafter, the processor 164 in step 820 determines which of four conditions exist based on the time of day, the sunrise time value SR, and the sunset time value SS. These conditions relate generally to daylight hours, nighttime hours, a transition time (TTND) from night to day, and a transition time (TTDN) from day to night. Table 1 shows the possible conditions:

TABLE 1

| | | |
|---|---|---|
| 1. | SR + TTND < HR < SS | (daylight) |
| 2. | (HR > SS + TTDN) or (HR < SR) | (nighttime) |
| 3. | SR ≤ HR ≤ SR + TTND | (transition) |
| 4. | SS ≤ HR ≤ SS + TTDN | (transition) |

As noted above in connection with FIG. 5, the values of SR and SS may vary throughout the calendar year. Thus, step 810 may further include retrieving from memory 180 the values of SR and SS, based on the date information in the real-time clock. For example, the values SR and SS may be retrieved based on the month value of M In addition, the transition time values TTND and TTDN may be constant, and be the same. In the example of FIG. 7, the value of each of TTND and TTDN is two (2) hours.

The processing circuit 164 then proceeds based on which of the conditions 1 to 4 exists. If condition 1 exists, then the processing circuit 164 executes step 825. If condition 2 exists, then the processing circuit 164 executes step 830. If condition 3 exists, then the processing circuit 164 executes step 835. If condition 4 exists, then the processing circuit 164 executes step 840.

In step 825, the processing circuit 164 sets the threshold value TH to $TH_{M,1}$, and then proceeds to step 845. In step 830, the processing circuit 164 sets the threshold value TH to $TH_{M,0}$, and then proceeds to step 845. In step 835, the processing circuit 164 sets the threshold value TH to:

$$TM = TM_{M,0} + \left(\frac{TM_{M,1} - TM_{M,0}}{TTND}\right)(CV - SR) \quad (3)$$

where CV is the current clock value. The equation represents the linear slope between 6:00 and 8:00 on FIG. 7. After step 835, the processing circuit 164 proceeds to step 845. In step 840, the processing circuit 164 sets the threshold value TH to:

$$TM = TM_{M,1} + \left(\frac{TM_{M,0} - TM_{M,1}}{TTDN}\right)(CV - SS) \quad (4)$$

where CV is the current clock value. The equation represents the linear slope between 19:00 and 21:00 on FIG. 7. After step 840, the processing circuit 164 proceeds to step 845.

In step 845, the processing circuit 164 has completed step 340 of FIG. 3 by obtaining the proper value TH, and can proceed to step 345 as described above.

Referring again to step 815, which occurs when the real-time clock is not accurate, the processing circuit 164 sets TH=$TH_{0,0}$. The processing circuit 164 thereafter proceeds to step 845. The $TH_{0,0}$ value is preferably set to (or at least based on) the maximum temperature threshold in the array $TH_{M,D}$, to reduce the occurrences of false positives from ambient temperature.

The operations of FIG. 8 thus provide an improved, but more complex version of the variable, time dependent thresholds discussed above in connection with FIGS. 5 and 6. It will be appreciated that the variable thresholds described herein have utility even in meters that do not employ temperature adjustments. For example, physical location of the temperature sensor 160 in another part of the meter 112, for example, near the blades 156, may obviate the need for temperature compensation, or may only require minor current-based temperature compensation. In such a case, however, the time-dependent thresholds discussed in connection with FIGS. 5 to 8 would nevertheless provide advantages.

It will also be appreciated that the system may be configured to use more than twelve sets of daily thresholds (one set per month) as taught herein. For example, it may be sufficient to include as few as four sets, particularly in warm climates, and it may be advantageous to include more than twelve sets in some cases.

Moreover, it will be appreciated that the temperature measurement compensation operations described further above have utility even in cases where a single threshold is used regardless of time or date. In addition, it will be appreciate that the combination of temperature adjustment and threshold comparisons may be carried out in multiple, mathematically equivalent ways. Additionally, it will be appreciated that although the meter 112 is described as using current sensors in the form of current transformers, it will be appreciated that he inventions described herein are readily applicable to meters that employ other types of current measurement devices (e.g. shunts) that work with or include a conductor (referred to herein as a current coil or primary coil) carrying large magnitude currents.

In addition, it has been experimentally determined that the effects of attenuated heat transfer from a meter current coil (i.e. load carrying conductor) to a board mounted sensor are significant at air gaps as low as 0.1 inches. Thus, the embodiments described above can offer advantages when the temperature sensor is as little as 0.1 inches away from the current coil.

Accordingly, in other configurations in which at least the same amount of thermal insulation separates the temperature sensor from the current coil, the inventive techniques described here would demonstrate advantages.

It will therefore be understood that the above-described embodiments are merely illustrative, and that those of ordinary skill in the art may readily devise their own modifications that incorporate the principles of various aspects of the present invention and fall within the spirit and scope thereof.

What is claimed is:

1. A utility meter comprising:
   a current coil, wherein each end of the current coil is configured for connection to a respective meter socket;
   a temperature sensor; and
   a processing circuit configured to:
      receive a current measurement signal that represents a measured current through the current coil;
      determine a temperature adjustment value using the measured current through the current coil;
      receive a sensor signal from the temperature sensor;
      determine a meter temperature using a temperature that corresponds to the sensor signal received from the temperature sensor and the temperature adjustment value;
      compare the meter temperature to a temperature threshold; and
      when the meter temperature exceeds the temperature threshold, determine that an abnormal condition exists and generate an output signal indicating the abnormal condition.

2. The utility meter of claim 1, further comprising:
   a metrology circuit configured to generate the current measurement signal and send the current measurement signal to the processing circuit.

3. The utility meter of claim 1, further comprising:
   a transceiver configured to receive a signal from a remote system that includes current temperature information, wherein the processing circuit is further configured to use the current temperature information to determine the temperature threshold.

4. The utility meter of claim 1, further comprising:
   a transceiver configured to receive the output signal from the processing circuit and transmit a signal to an external device indicating the abnormal condition.

5. The utility meter of claim 1, further comprising:
   a display configured to display an visual indication of the abnormal condition in response to the output signal indicating the abnormal condition.

6. The utility meter of claim 1, wherein the temperature sensor is integrated with the processing circuit.

7. A method for detecting an abnormal condition in a utility meter, comprising:
   measuring current through a current coil, wherein the current coil is configured to connect to a mounting device for the utility meter;
   determining a temperature adjustment value using the measured current through the current coil;
   receiving a sensor signal from a temperature sensor;
   determining a meter temperature using a temperature that corresponds to the sensor signal received from the temperature sensor and the temperature adjustment value;
   comparing the meter temperature to a temperature threshold; and
   when the meter temperature exceeds the temperature threshold, determining that the abnormal condition exists and generating an output signal indicating the abnormal condition.

8. The method of claim 7, further comprising:
   determining whether a real-time clock is in an operating condition;
   when the real-time clock is in the operating condition, then using the real-time clock to determine the temperature threshold based on at least one of time of day information and date information maintained by the real-time clock; and
   when the real-time clock is in a failure condition, then using a default temperature threshold.

9. The method of claim 7, further comprising:
   determining the temperature threshold using temperature information received from a remote system.

10. The method of claim 7, wherein determining that the abnormal condition exists comprises:
    determining whether a difference between the meter temperature and the temperature threshold satisfies a first alarm level or a second alarm level;
    when the difference satisfies the first alarm level, then setting a persistent first alarm level flag and a present first alarm level flag; and
    when the difference satisfies the second alarm level, then setting a persistent second alarm level flag and a present second alarm flag.

11. The method of claim 10, further comprising:
    determining a second meter temperature;
    comparing the second meter temperature to a second temperature threshold; and
    when the second meter temperature is within the second temperature threshold, then clearing the present first alarm flag or the present second alarm flag.

12. The method of claim 10, further comprising:
    controlling a disconnect unit to form an open circuit in the current coil in response to the output signal indicating the abnormal condition.

13. A method for detecting an abnormal condition in a utility meter, comprising:
- determining a temperature adjustment value based on meter self-heating under normal operating conditions;
- receiving a sensor signal from a temperature sensor;
- determining a meter temperature based on a temperature that corresponds to the sensor signal received from the temperature sensor as adjusted by the temperature adjustment value;
- comparing the meter temperature to a temperature threshold, wherein the temperature threshold is based on at least one of time of day information and date information; and
- when the meter temperature exceeds the temperature threshold, determining that the abnormal condition exists and generating an output signal indicating the abnormal condition.

14. The method of claim 13, wherein determining a temperature adjustment value based on meter self-heating under normal operating conditions, comprises:
- measuring current through a current coil of the utility meter;
- determining a self-heating temperature value using the measured current through the current coil; and
- filtering the self-heating temperature value to account for any time lag between current transitions in the current coil to obtain the temperature adjustment value.

15. The method of claim 13, further comprising:
- determining whether a real-time clock is in an operating condition;
- when the real-time clock is in the operating condition, then using the real-time clock to determine the temperature threshold based on at least one of time of day information and date information maintained by the real-time clock; and
- when the real-time clock is in a failure condition, then using a default temperature threshold.

16. The method of claim 13, further comprising:
- determining the temperature threshold using temperature information received from a remote system.

17. The method of claim 13, wherein determining that the abnormal condition exists comprises:
- determining whether a difference between the meter temperature and the temperature threshold satisfies a first alarm level or a second alarm level;
- when the difference satisfies the first alarm level, then setting a persistent first alarm level flag and a present first alarm level flag; and
- when the difference satisfies the second alarm level, then setting a persistent second alarm level flag and a present second alarm flag.

18. The method of claim 17, further comprising:
- determining a second meter temperature;
- comparing the second meter temperature to a second temperature threshold; and
- when the second meter temperature is within the second temperature threshold, then clearing the present first alarm flag or the present second alarm flag.

19. The method of claim 13, further comprising:
- controlling a disconnect unit to form an open circuit in a current coil in response to the output signal indicating the abnormal condition.

20. The method of claim 13, wherein the temperature threshold varies as a function of time.

* * * * *